United States Patent [19]
Selwa

[11] Patent Number: 4,990,912
[45] Date of Patent: Feb. 5, 1991

[54] DIGITAL PEAK/VALLEY DETECTOR

[75] Inventor: Anthony P. Selwa, Brownsburg, Ind.

[73] Assignee: Wavetek RF Products, Inc., Indianapolis, Ind.

[21] Appl. No.: 260,819

[22] Filed: Oct. 21, 1988

[51] Int. Cl.⁵ ............................................. H03M 1/00
[52] U.S. Cl. .................................... 341/132; 341/146
[58] Field of Search .............................. 341/132, 164

[56] References Cited

U.S. PATENT DOCUMENTS

| | | | |
|---|---|---|---|
| 3,471,853 | 10/1969 | Brooks et al. | 341/132 |
| 3,800,236 | 3/1974 | Riethmuller et al. | 341/132 |
| 4,001,604 | 1/1977 | Parks et al. | 341/132 |
| 4,165,508 | 8/1979 | Barter | 341/132 |
| 4,367,457 | 1/1983 | Tadauchi et al. | 341/164 |

FOREIGN PATENT DOCUMENTS 58-94198 6/1983 Japan .

OTHER PUBLICATIONS

Analog-Digital Conversion Handbook, 1986, p. 131, Prentice-Hall.

Primary Examiner—William M. Shoop, Jr.
Assistant Examiner—Helen Kim
Attorney, Agent, or Firm—Lisa & Lisa

[57] ABSTRACT

A peak-valley detector of an analog signal which provides a digital output of the analog signal. A digital counter is used having an output coupled to a digital-to-analog convertor. The output of the digital-to-analog convertor is compared to an input analog signal. The output of the comparator is used to control the input of a clock signal to the counter. A selective invertor controls whether the comparator's output allows counting for signals above or below the digital-to-analog convertor's output level.

22 Claims, 2 Drawing Sheets

DIGITAL PEAK/VALLEY DETECTOR

BACKGROUND OF THE INVENTION

The present invention relates, in general, to digital peak/valley detectors and, more particularly, to digital peak/valley detectors of analog signals.

Currently, there are many various digital-to-analog (D/A) convertors (DACs) known in the art. These DACs are used in various circuits to perform numerous activities such as tracking type D/A convertors which track an analog signal and provide a digital output of the signal.

A drawback of the current tracking D/A type convertors is that they are unable to provide information on maximum (peak) or minimum (valley) values of the analog signals.

Accordingly, it is an object of the present invention to provide a digital peak/valley detector which overcomes the above deficiencies.

A further object of the present invention is to provide a digital peak/valley detector which will detect peaks and valleys of an analog signal.

Another object of the present invention is to provide a digital peak/valley detector which has very little droop.

Still another object of the present invention is to provide a digital peak/valley detector which is economical to produce.

An advantage of the present invention is that the digital peak/valley detector can be used to determine frequency modulation (FM) deviations.

Another advantage of the present invention is that the digital peak/valley detector can be used to determine the percent of modulation in an amplitude modulation (AM) signal.

Still another advantage of the present invention is that the digital peak/valley detector can be used to determine signal-to-noise ratios.

Yet another advantage of the present invention is that the digital peak/valley detector can be used to determine peak-to-peak signal values.

The above and other objects and advantages of the present invention are provided by the digital peak/valley detector described herein.

SUMMARY OF THE INVENTION

A particular embodiment of the present invention consists of a digital counter which has its output coupled to a digital-to-analog converter (DAC). The DAC's output is compared to the analog signal level in a comparator. The output of the comparator controls the input of a clock signal to the counter. A selective invertor controls whether the comparator's output allows counting for signals above or below the DAC's output level.

DETAILED DESCRIPTION OF THE DRAWINGS

Figure 1:
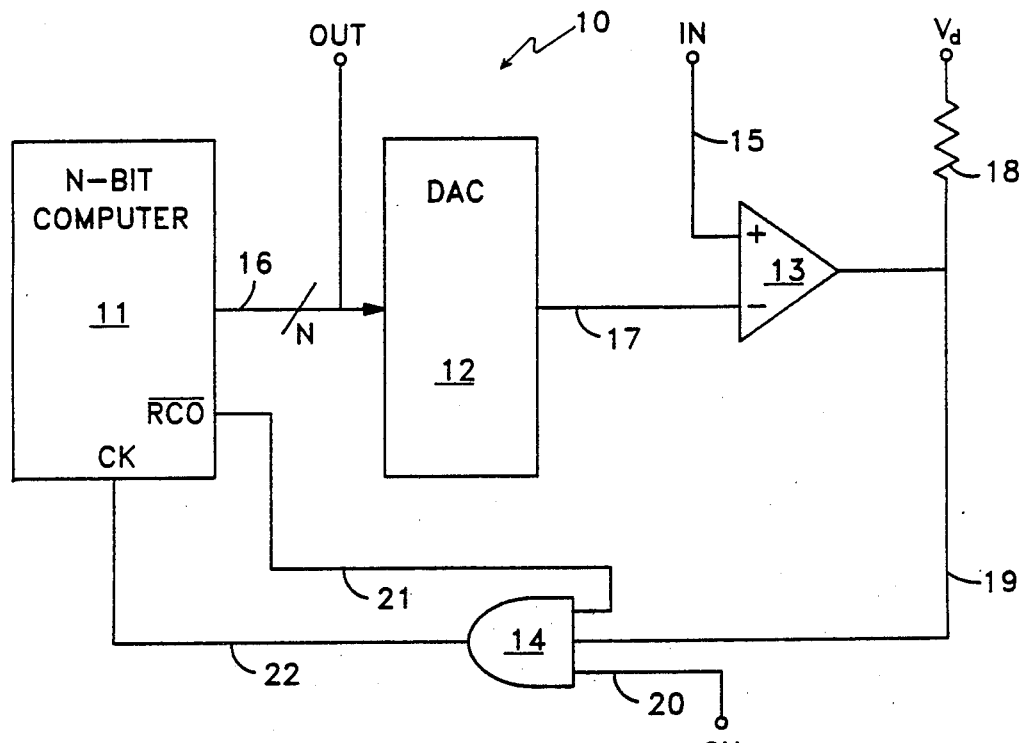
FIG. 1 is a block diagram of the present invention illustrating the peak detection operation of the circuit.

Referring initially to FIG. 1, a block diagram, generally designated 10, of the present invention representing the peak detection operation of circuit 10 is illustrated. Circuit 10 consists essentially of an N-bit counter 11, a digital-to-analog converter (DAC) 12, a comparator 13, and a logical AND gate 14. Gate 14 is provided to allow adjustment of the value in counter 11.

The output of counter 11 is transmitted to DAC 12 along a bus 16. It is the signal on bus 16 that will eventually provide the digital output signal indicative of the peak value of the input signal.

DAC 12 converts the digital signal from counter 11 into an analog signal which is then transmitted to the negative input of comparator 13 along a line 17. The analog signal to be tested is input along a line 15 to the positive input of comparator 13.

The output of comparator 12 is coupled to a voltage, $V_d$, by a resistor 18 and to an input of AND gate 14 along a line 19. Also input to AND gate 14 is a clock signal along a line 20. A third input to AND gate 14 is the inverse of the Ripple Carry Output from counter 11 coupled to gate 14 by a line 21. The output of gate 14 is coupled to an increment input of counter 11 along a line 22.

In order to determine the peak of an analog signal, N-bit counter 11 is preset to a zero level. This will result in DAC 12 transmitting a signal along line 17 which is lower than the analog signal input along line 15. Since the value of the input signal is greater than the signal from DAC 12, comparator 13 will output a positive signal. The positive signal from comparator 13 acts to enable gate 14 such that the clock signal along line 20 will pass through gate 14 to counter 11.

The clock pulse will increment counter 11 which will in turn increase the value of the signal output from DAC 12. If the output from DAC 12 along line 17 is less than the input signal along line 15, the output from comparator 13 will allow the clock input to continue to increment counter 11.

When the output of counter 11 reaches the point where the corresponding output of DAC 12 is equal to, or greater than, the input signal, the output of comparator 13 will drop to zero, or to a negative value. The zero output of comparator 13 will be transmitted to gate 14 along line 19 where it will act to inhibit the clock signal from passing to counter 11. At this point, the digital output of counter 11 represents the peak value of the analog signal.

If the peak value of the analog signal input along line 15 should exceed the maximum value of counter 11, as represented by the output of DAC 12 on line 17, then counter 11 would reset to zero and count up again. To prevent this type of cycling, the ripple carry output from counter 11 is input to gate 14 along line 21. If counter 11 reaches its maximum value, it will output a signal on line 21 to gate 14 which will inhibit the clock signal on line 20 from being passed to counter 22.

As described, circuit 10 will provide a digital output indicative of the peak value of the analog input signal.

Figure 2:
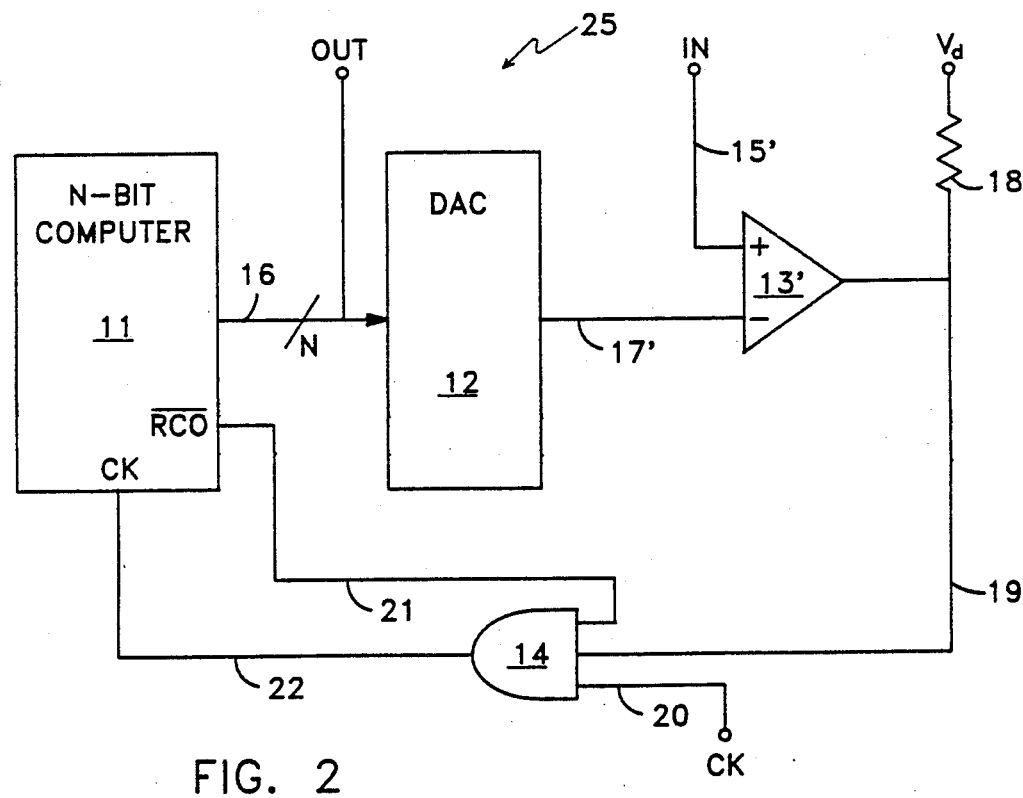
FIG. 2 is a block diagram of the present invention illustrating the valley detection operation of the circuit.

Referring now to FIG. 2, a block diagram, generally designated 25, of the present invention representing the valley detection operation of the circuit is illustrated. Circuit 25 is the same circuit as circuit 10 except that a line 15' provides the analog input to the negative input of a comparator 13' and the analog signal from DAC 12 is coupled to the positive input of comparator 13' along a line 17'.

In operation, counter 11 is set to its highest value, instead of the lowest value as in FIG. 1. DAC 12 will then output a high analog signal on line 17' to comparator 13'. Initially, the signal from DAC 12 on line 17' will be higher than that of the input signal on line 15'. This will provide a positive output from comparator 13' which will enable the clock signal on line 20 to pass through gate 14 to counter 11. The clock pulse will serve to decrement counter 11 thereby decreasing the value of the signal output from DAC 12.

Once the value of the signal from DAC 12 has reached a value equal to, or less than, the value of the signal on line 15', the output of comparator 13' will go to zero, or to a negative value. This output from comparator 13, will act to inhibit the clock signal from passing through gate 14. At this point, the digital output of counter 11 will be the digital representation of the valley value of the analog input signal.

As was pointed out with respect to FIG. 1, circuit 25 may also start cycling if the valley of the input signal is below that which can be emulated by counter 11. Again, to avoid this cycling of counter 11, the ripple carry output of counter 11 is coupled to the input of gate 14. If counter 11 reaches its lowest value, the ripple carry output signal will serve to inhibit the passage of the clock signal through gate 14.

It should be noted here that since the signal being measured is an analog signal, the input along lines 15 or 15' will vary with time. In FIG. 1, this variable input signal will result in counter 11 being incremented during a peak and being fixed during a valley. Eventually, counter 11 will be pushed up to the maximum peak value of the input signal. Because the input signal cycles, it may take several cycles for the output of counter 11 to reach the ultimate peak value. However, since the input signals are generally of a high enough frequency, counter 11 will reach the peak value in a minimal amount of time.

Figure 3:
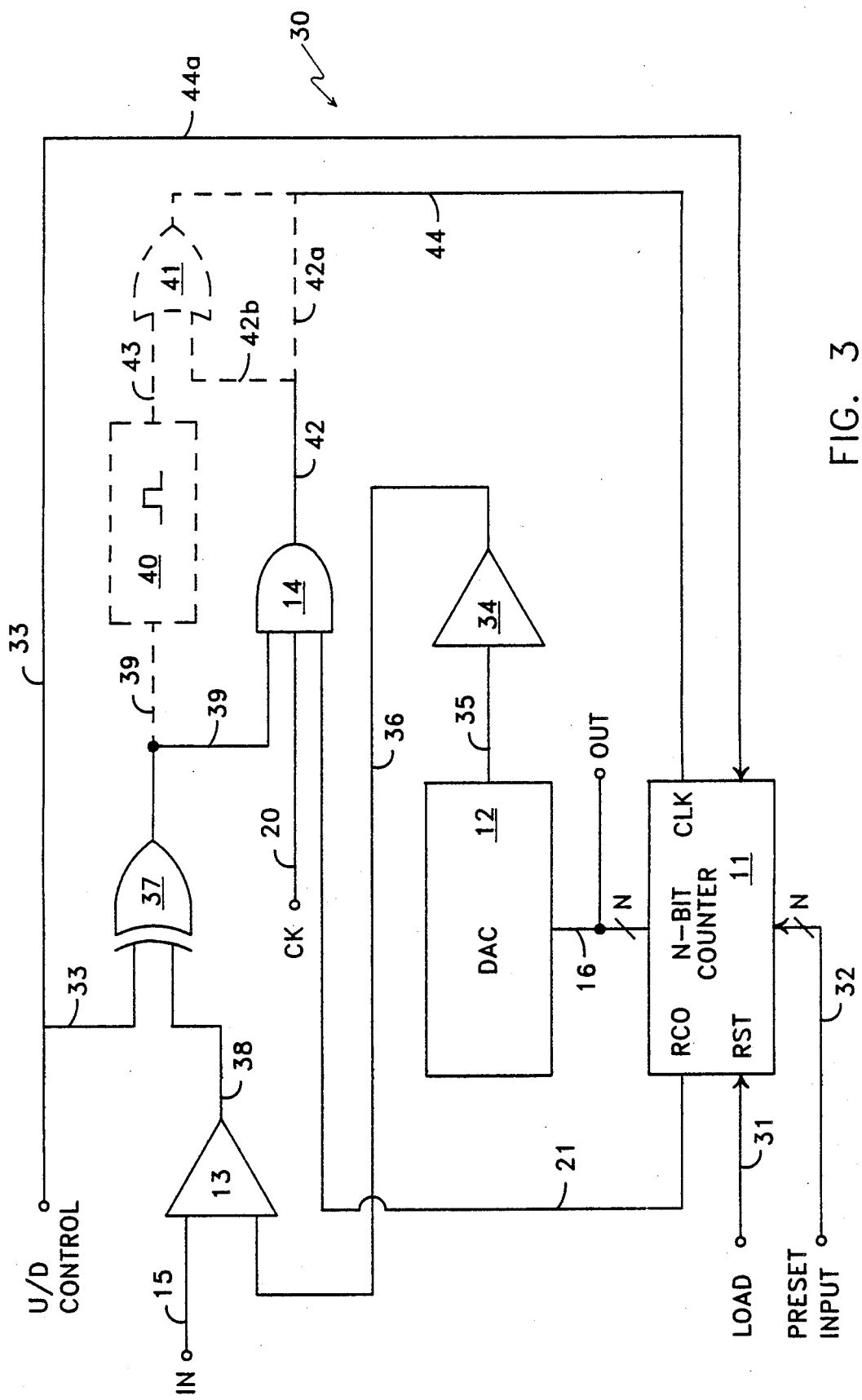
FIG. 3 is a block diagram of the present invention incorporating the functions illustrated in FIGS. 1 and 2.

Referring now to FIG. 3, a block diagram representing a circuit of the present invention, generally designated 20, incorporating the functions illustrated in FIGS. 1 and 2, is illustrated. Circuit 30 consists of counter 11, DAC 12, comparator 13, and AND gate 14 along with several additional devices.

Counter 11 has several additional inputs identified. A load input is coupled to counter 11 along a line 31. The load input serves to preset counter 11 to a predetermined value, generally zero or its highest value A preset input is coupled to counter 11 through a parallel input line 32. Line 32 contains the value to which counter 11 is set when the load signal is activated on line 31. An up/down (U/D) control signal is coupled to counter 11 along a line 33. The setting on this line determines whether counter 11 is being incremented, measuring peak values, or decremented, measuring valley values. In some counters, rather than an up/down control input, two clocks are used, an up clock and a down clock. In this case, the up/down control signal would be used to determine which clock input receives the clock signal.

The output of counter 11 is transmitted to DAC 12 along line 16. Line 16 also provides the output of circuit 30. The output of DAC 12 is transmitted to an operational amplifier 34 along a line 35 and on to comparator 13 along a line 36. Amplifier 34 is provided to convert the output of DAC 12, typically a current signal, to a voltage signal for input to comparator 13. However, there are DACs available which provide a voltage output signal. If a DAC is used that provides a voltage output signal, amplifier 34 may be eliminated from circuit 30.

Comparator 13 compares the signal on line 36 to the input analog signal on line 15. The output of comparator 13 is coupled to a first input of an exclusive-OR gate 37 along a line 38. The second input of gate 37 is coupled to the up/down control signal by line 33. The output of gate 37 is transmitted by a line 39 to AND gate 14.

The clock signal is coupled to a second input of gate 14 by line 20. The third input of gate 14 is coupled to the ripple carry output of counter 11 by line 21. The output of gate 14 is coupled to counter 11 along lines 42, 42a, and 44.

An alternative configuration includes the output of gate 37 also being coupled to a one shot 40 by line 39. The output of one shot 40 is then coupled to an OR gate 41 by a line 43. In addition, the output of gate 14 is coupled to gate 41 through lines 42 and 42b instead of being coupled directly to counter 11. The output of OR gate 41 is then coupled to counter 11 through lines 44a and 44.

One shot 40 is provided to compensate for situations where the input to gate 14 from gate 37 are of a duration shorter than the clock signal input to gate 14 on line 20. When this occurs, the passage of the clock signal through gate 14 can be enabled and disabled before the clock completes a pulse. By incorporating one shot 40 in the circuit, the transmission of at least one clock pulse to counter 11 is ensured. In order to prevent counter 11 from receiving a clock pulse from both gate 14 and one shot 40 for the same signal from comparator 13, the outputs of gate 14 and one shot 40 are ORed together in gate 41.

In operation, a load signal is sent to counter 11 along line 31. This causes the value of the preset input on line 32 to be loaded into counter 11. If a peak is to be determined, a low value, such as zero, is loaded into counter 11. To measure the peak value, the U/D control signal on line 33 is set to enable an up count.

The digital output of counter 11 is then transmitted to DAC 12 where it is converted to an analog signal. Since the output of DAC 12 is a current output, the signal is passed through an operational amplifier 34 where it is converted to a voltage signal for comparison to the input analog signal.

Taking the input signal on line 15 as being coupled to the positive input of comparator 13 and the signal output from DAC 12 as being coupled to the negative input, then the U/D control signal for counting up on line 33 would be a "0". When the input signal on line 15 is greater than the signal from DAC 12, a digital "1" will be output on line 38 to gate 37. With line 33 set at "0" exclusive-OR 37 will output a "1" when comparator 13 provides a "1" input. The output from gate 37 will enable the clock pulse on line 20 to pass through gate 14 to counter 11 where it will increment the value of counter 11.

When the signal output from DAC 12 is of a value equal to, or greater than, the input signal, comparator 13 will output a "0". When input to gate 37, the "0" input from comparator 13 will be combined with the "0" input from line 33 to produce a "0" output from gate 37 and inhibit the clock signal on line 20 from passing through gate 14 to counter 11.

In order to determine a valley value of the input signal, a high digital number is loaded into counter 11 when a load signal is forwarded along line 31. In addition, the U/D control line is set to count-down to determine the minimum value. Keeping the same configurations as above, the U/D control signal on line 33 would be a "1".

The large digital number in counter 11 is then converted to an analog signal in DAC 12 and is transmitted to comparator 13 along line 36. The signal on line 36 is then compared to the input analog signal on line 15.

If the signal on line 15 is larger than the signal on line 36, a "1" is output to gate 37. The digital "1" output from comparator 13 is then combined with the "1" on line 33 to provide a "0" output from exclusive-OR gate 37. This serves to inhibit gate 14 from passing along the clock signal to counter 11.

If the signal on line 15 is less than the signal on line 36, a "0" is output to gate 37. The digital "0" output from comparator 13 is then combined with the "1" on line 33 to provide a "1" output from exclusive-OR gate 37. This serves to enable gate 14 to allow the passage of the clock signal to counter 11. The clock signal will then decrement the number in counter 11 until the output from gate 37 disables gate 14.

It should be understood that, by providing the analog signal input on line 15 to the negative input of comparator 13 and the signal from DAC 12 to the positive input of comparator 15, reversed from the above description, the same results will be provided if the U/D control signal on line 33 is also inverted.

Another function that may be performed using circuit 30 is that of measuring the peak-to-peak, or peak-to-valley, signal level. To perform this function, circuit 30 is set to count up by setting the up/down control signal on line 33 to count up and by loading the preset value, generally zero, into counter 11. The maximum peak value of the input analog signal is then determined, as described above, and stored.

Once the peak value has been determined, the up/down control signal is shifted to count down. This shift to count down is performed without loading the preset maximum number into counter 11, as was done for valley detection above. In this procedure, circuit 30 operates more efficiently by starting at the maximum peak value and counting down rather than starting at the maximum value for counter 11. When the minimum peak value, or valley, is determined, it is compared with the maximum peak value to determine the peak-to-peak value.

Another function that may be performed by circuit 30 is that of measuring frequency modulation (FM) deviations. To measure the FM deviation, the input signal is transmitted to circuit 30 by an FM detector. A peak-to-peak measurement is then performed as described above. Using a known sensitivity of the FM detector, the peak-to-peak value can be converted to a frequency value.

Still another function that may be performed by circuit 30 is that of measuring the percentage of modulation in an amplitude modulation (AM) signal. To measure the percent of modulation, the peak-to-peak measurement is taken as described above. The percent of modulation is then determined using the following equation:

$$M\% = (Peak - Valley)/(Peak) \times 100.$$

where:
M% is the percent of modulation in the AM signal;
Peak is the maximum peak value; and
Valley is the minimum peak value.

These procedures presume that linear detectors are used to produce the signals applied to the circuits If a nonlinear type of detector is utilized, the effect of the detector on the peak and valley results must also be taken into account.

Yet another function that may be performed by circuit 30 is that of measuring the signal-to-noise ratio (SNR) of the input signal. To perform this function, circuit 30 is first used to determine the peak value of the input signal. The device providing the input signal to circuit 30 is then set to the frequency at which the noise is to be measured A peak-to-peak measurement of the noise is then made using the procedure set forth above. The signal-to-noise ratio is then determined using the average value, or other appropriate weighting process (such as RMS), of the noise signal. To determine the worst case value of the SNR the input signal's and noises's peak values may be used.

One method that may be utilized to increase the response of circuit 30 is to setup the clock signal's waveform to be a logic "1" during most of its cycle. This allows any rapid variation of the input signal to toggle the output of comparator 13 which will cause synthetic clock events to be output from AND gate 14. This method would be useful as signals such as a demodulated television waveform where the rapid rate of synchronizing pulses or rapid video changes will effectively speed up the clocking signal applied to counter 11. This technique will largely eliminate the need for one-shot 40. However, since the clock signal will momentarily switch to zero during a portion of its cycle, one-shot 40 would still be of use.

Thus, it will be apparent, upon reviewing this specification, to one skilled in the art that there has been provided in accordance with the invention, an apparatus that fully satisfies the objects, aims, and advantages set forth above.

While the invention has been described in conjunction with specific embodiments thereof, it is evident that many alterations, modifications, and variations will be apparent to those skilled in the art in light of the foregoing description. Accordingly, it is intended to embrace all such alterations, modifications, and variations in the appended claims.

I claim:
1. A digital peak/valley detector for measuring an analog input signal comprising:
counter means for varying a digital signal in response to an adjusting a signal;
convertor means for converting said digital signal from said counter means to an analog signal;
comparing means for comparing said analog input signal to said analog signal from said convertor means; and
adjusting means controlled by said comparing means for providing said adjusting signal to said counter, said adjusting means comprising a logical AND gate having a first input coupled to an inhibit output of said counter means.
2. The digital peak/valley detector of claim 1 wherein said counter means comprises an N-bit counter where N is the number of bits in a word of output from said counter.

3. The digital peak/valley detector of claim 1 wherein said convertor means comprises a digital-to-analog convertor.

4. The digital peak/valley detector of claim 1 wherein said logical AND gate additionally comprises a second input coupled to an output of said comparing means and a third input coupled to a clock input signal.

5. The digital peak/valley detector of claim 1 further comprising an increment/decrement means for controlling said adjusting means to perform one of an increment function on said counter means and a decrement function on said counter means.

6. A digital peak/valley detector comprising:
   a counter having a clock input, and a digital signal output;
   a digital-to-analog convertor having a digital input coupled to said digital signal output of said counter and an analog output;
   a comparator having a first input coupled to an analog input signal and a second input coupled to said analog output of said digital-to-analog convertor;
   a logical AND gate having a first input coupled to an output of said comparator, a second input coupled to a clock input, and an output coupled to said clock input of said counter.

7. The digital peak/valley detector of claim 6 wherein said counter further comprises a load input, a preset input, an up/down control input, and a ripple carry output.

8. The digital peak/valley detector of claim 7 further comprises a logical exclusive-OR gate having a first input coupled to an up/down control signal, a second input coupled to said output of said comparator, and an output coupled to said first input of said logical AND gate.

9. The digital peak/valley detector of claim 8 wherein said logical AND gate further comprises a third input coupled to said ripple carry output of said counter.

10. The digital peak/valley detector of claim 9, further comprising:
    a one shot having an input coupled to said output of said exclusive-OR gate and an output; and
    a logical OR gate having a first input coupled to said output of said one shot, a second input coupled to said output of said logical AND gate, and an output coupled to said clock input of said counter.

11. The digital peak/valley detector of claim 10, further comprising an operational amplifier having an input coupled to said output of said digital-to-analog convertor and an output coupled to said second input of said comparator.

12. The digital peak/valley detector of claim 6 further comprising:
    a one shot having an input coupled to said output of said comparator and an output; and
    a logical OR gate having a first input coupled to said output of said one shot, a second input coupled to said output of said logical AND gate, and an output coupled to said clock input of said counter.

13. The digital peak/valley detector of claim 12 further comprising an operational amplifier having an input coupled to said output of said digital-to-analog convertor and an output coupled to said second input of said comparator.

14. The digital peak/valley detector of claim 6 further comprising an operational amplifier having an input coupled to said output of said digital-to-analog convertor and an output coupled to said second input of said comparator.

15. A method for determining a digital peak value of an analog input signal comprising the steps of:
    presetting a counter means for varying a digital signal to a minimum value;
    converting said digital signal to an analog signal;
    comparing said analog signal with said analog input signal;
    transmitting an adjusting signal to said counter means if said analog input signal has a value greater than a value of said analog signal; and
    incrementing said digital signal of said counter means if said adjusting signal is transmitted thereto.

16. A method for determining a digital valley value of an analog input signal comprising the steps of:
    presetting a counter means for varying a digital signal in response to an adjusting signal to a maximum value;
    converting said digital signal to an analog signal;
    comparing said analog signal with said analog input signal;
    transmitting an adjusting signal to said counter means if said analog input signal has a value less than a value of said analog signal; and
    decrementing said digital signal of said counter means if said adjusting signal is transmitted thereto.

17. A method for determining a peak-to-peak signal level utilizing a counter means for varying a digital signal in response to an adjusting signal, convertor means for converting said digital signal from said counter means to an analog signal, comparing means for comparing an analog input signal to said analog signal from said convertor means, adjusting means controlled by said comparing means for providing said adjusting signal to said counter, and increment/decrement means for controlling said adjusting means to perform one of an increment function on said counter means and a decrement function on said counter means, said method comprising the steps of:
    setting said increment/decrement means to control said adjusting means to perform one of an increment function on said counter means and a decrement function on said counter means;
    presetting said counter means to an initial value;
    determining a first peak value of said analog input signal;
    setting said increment/decrement means to control said adjusting means to perform a remaining one of an increment function on said counter means and a decrement function on said counter means;
    determining a second peak value of said analog input signal; and
    comparing said first and second peak values to determine said peak-to-peak signal level.

18. The method of claim 17 wherein said first peak value is a maximum peak value and said second peak value is a minimum peak value.

19. The method of claim 17 wherein said counter means comprises an N-bit counter where N is the number of bits in a word of output from said counter.

20. The method of claim 17 wherein said convertor means comprises a digital-to-analog convertor.

21. The method of claim 17 wherein said adjusting means comprises a logical AND gate having a first input coupled to an output of said comparator means and a second input coupled to a clock input signal.

22. The method of claim 21 wherein said logical AND gate further comprises a third input coupled to an inhibit output of said counter means.

* * * * *